United States Patent
Blersch

(10) Patent No.: US 6,903,262 B2
(45) Date of Patent: Jun. 7, 2005

(54) SHIELDING ELEMENT FOR ELECTRIC AND/OR ELECTRONIC COMPONENTS OF AN ELECTRIC AND/OR ELECTRONIC CIRCUIT

(75) Inventor: Werner Blersch, Hochstetten (DE)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/498,473
(22) PCT Filed: Dec. 17, 2001
(86) PCT No.: PCT/EP01/14904
§ 371 (c)(1), (2), (4) Date: Nov. 22, 2004
(87) PCT Pub. No.: WO03/053119
PCT Pub. Date: Jun. 26, 2003

(65) Prior Publication Data
US 2005/0068758 A1 Mar. 31, 2005

(51) Int. Cl.[7] ................................................ H05K 9/00
(52) U.S. Cl. .............................. 174/35 GC; 174/35 R; 361/816
(58) Field of Search .......................... 174/35 R, 35 GC; 361/816, 818, 800

(56) References Cited

U.S. PATENT DOCUMENTS

| | | | | |
|---|---|---|---|---|
| 5,365,410 A | * | 11/1994 | Lonka | 361/816 |
| 5,614,694 A | * | 3/1997 | Gorenz et al. | 174/35 R |
| 5,886,879 A | * | 3/1999 | Matuschik | 361/818 |
| 6,136,131 A | * | 10/2000 | Sosnowski | 156/256 |
| 6,169,666 B1 | | 1/2001 | Venant | 361/816 |
| 6,178,097 B1 | | 1/2001 | Hauk, Jr. | 361/816 |
| 6,384,324 B2 | * | 5/2002 | Flegeo | 174/35 GC |
| 6,552,261 B2 | * | 4/2003 | Shlahtichman et al. | 174/35 R |
| 6,831,224 B2 | * | 12/2004 | Koivusilta | 174/35 GC |

FOREIGN PATENT DOCUMENTS

| | | |
|---|---|---|
| DE | 195 09 553 | 7/1996 |
| EP | 0993244 | 4/2000 |

* cited by examiner

Primary Examiner—Hung V. Ngo
(74) Attorney, Agent, or Firm—Perman & Green, LLP.

(57) ABSTRACT

The present invention relates to a shielding element for electric and/or electronic components of an electric and/or electronic circuit, including an annular side wall (11) for surrounding those elements (25) of a circuit that have to be shielded against electromagnetic radiation, said side wall (11) defining a bottom and a ceiling opening (15), and a cover (12, 12') for closing the ceiling opening (15). To provide a shielding element that facilitates a sampling of an electric and/or electronic circuit arrangement said cover (12, 12') is either detachable attached to said side wall (11) by joint means that comprises a predetermined breaking (26) line or defined together with said side wall (11) as parts of an integral cap (32) by a predetermined breaking line (26). In both cases said predetermined breaking line (26) has to be destroyed for detaching said cover (12, 12') from said side wall (11).

16 Claims, 3 Drawing Sheets

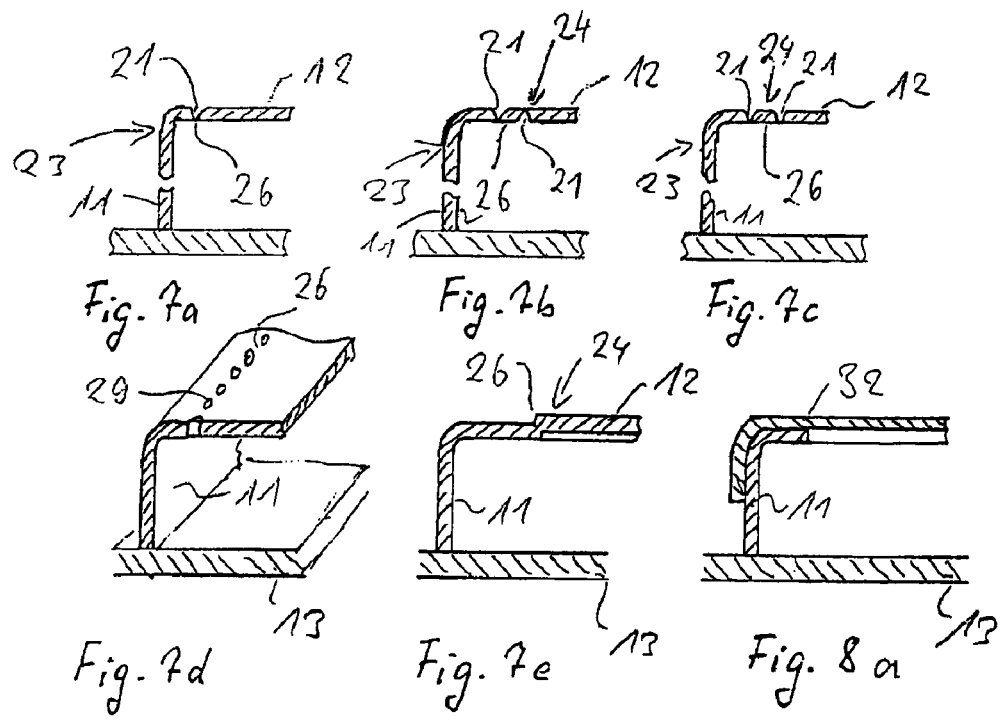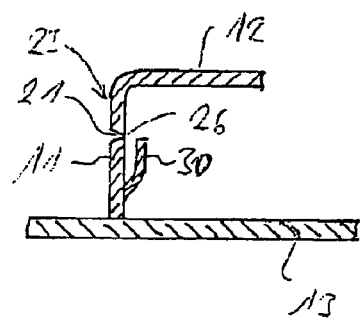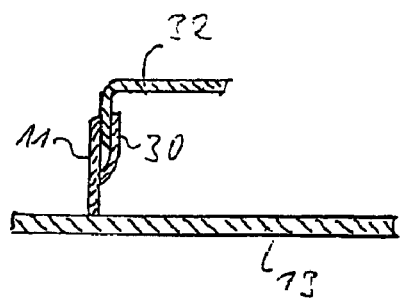

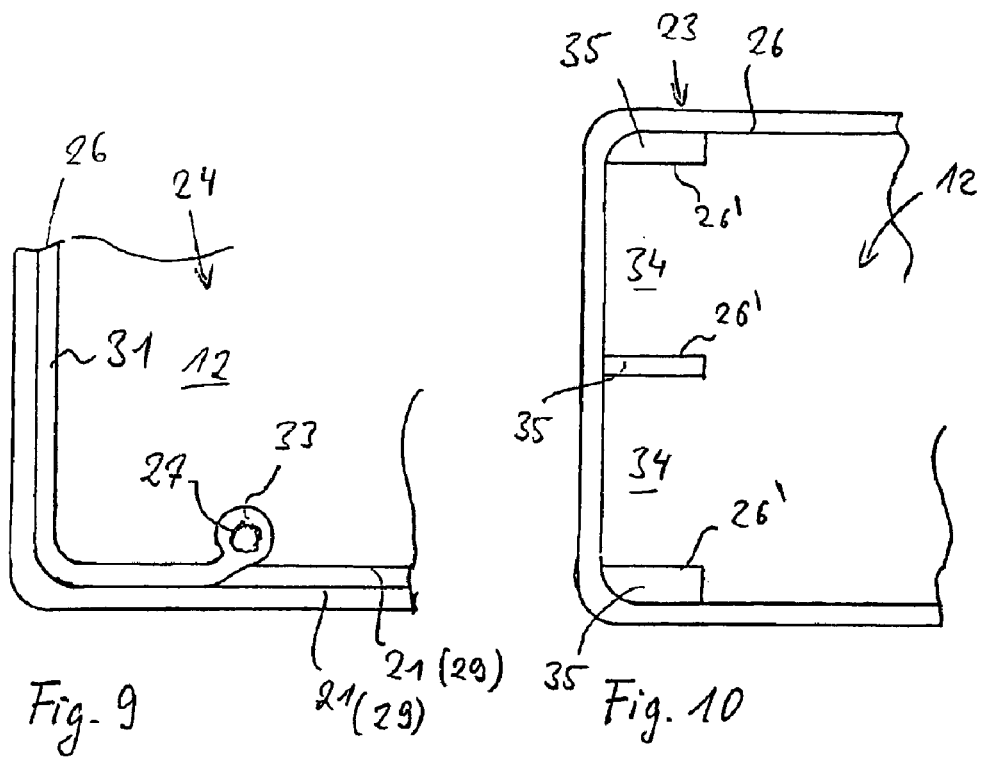

SHIELDING ELEMENT FOR ELECTRIC AND/OR ELECTRONIC COMPONENTS OF AN ELECTRIC AND/OR ELECTRONIC CIRCUIT

This application is the National Stage of International Application No. EP01/14904, International Filing Date, Dec. 17, 2001, which designated the United States of America, and which international application was published under PCT Article WO Publication No. WO 03/053119A1.

The present invention relates to a shielding element for electric and/or electronic components of an electric and/or electronic circuit, in particular to a shielding element that is used to shield such components mounted on a printed circuit board.

BACKGROUND OF THE INVENTION

Shielding elements are used in electric and/or electronic circuits to screen specific components of the circuit against an electromagnetic radiation, in particular against spurious emission or irradiation. In particular, screening or shielding elements are used to comply with the requirements of EMC (electro magnetic compatibility) standards.

Usually such shielding elements comprises an annular side wall that can be mounted on a printed circuit board in a usual way, e.g. by soldering, and that surrounds the components to be shielded. After mounting the annular side wall and the components to be shielded onto the printed circuit board, a cover is used to close a ceiling opening that is defined by the upper edge of the annular side wall. A bottom opening that is defined by the lower edge of the side wall is closed by the printed circuit board. The terms "upper" and "lower" are used in this description to define the location of parts of the shielding element relative to the printed circuit board irrespective of the orientation of the printed circuit board itself. Hence, the upper edge of the side wall is that edge that is in a remode position whereas the lower edge is that edge that is in contact with the printed circuit board after mounting.

As described above, mounting of a conventional shielding element onto a printed circuit board needs two mounting steps: First, mounting the side wall to the printed circuit bar and second, fixing the cover to the side wall.

SUMMARY OF THE INVENTION

It is an object of the present invention to provide a shielding element for electric and/or electronic components of an electric and/or electronic circuit that facilitates assembling of the circuit.

This object is achieved by a shielding element that comprises an annular side wall for surrounding those elements of a circuit that have to be shielded against electromagnetic radiation, the side wall defining a bottom and a ceiling opening, and a cover for closing the ceiling opening, wherein the cover is detachable attached to the side wall by joint means that comprises a predetermined breaking line and has to be destroyed for detaching the cover from the side wall.

According to the present invention the shielding element can be mounted onto a printed circuit board or therelike as one piece in one step but allows to open the ceiling opening of the shielding element by detaching the cover from the side wall by destroying a predetermined breaking line. Thus, the components screened by the shielding element are accessible for repair and maintenance without removing the complete shielding element but only the cover thereof. Since the cover of the inventive shielding element according to the invention is a lost part. After removing it the ceiling opening has to be closed by a usual cover element that can be mounted on the remaining annular side wall of the shielding element in a conventional manner, e.g. by snapping on or clamping.

Another advantage of the inventive shielding element is that the predetermined breaking line can act as a seal that proves that no unauthorized person has opened the cover. Otherwise in case that the predetermined breaking line has been destroyed this means that access to the components screened by the shielding element was possible.

According to an advantageous development of the present invention the cover comprises a strip-like peripheral portion overlapping a corresponding strip-like portion of the annular side wall and the predetermined breaking line is formed in an overlapping area of the cover and the side wall. In particular, it is possible that the cover is provided with a peripheral flange extending substantially perpendicular to its main surface and forming the portion for overlapping the annular side wall. Alternatively, the annular side wall is provided with an annular flange extending into the ceiling opening and forming the portion to be overlapped by the cover.

According to a refinement of the present invention the breaking line is formed by spot welding, soldering or gluing the cover to the annular side wall in the overlapping area.

In case that gluing is used to form the predetermined breaking line it is preferred that a tear of wire or strap is integrated into the predetermined breaking line to cut off the gluing line to facilitate removing the cover from the side wall.

Another possibility to facilitate the opening of the shielding element is to provide the cover thereof with tear open means for removing it from the side wall wherein these tear open means are preferably formed by a tongue for engaging a tear open tool.

Thus, the shielding element can be opened like a can used for beverages or food with the only difference that the tool for opening is not fixed to the shielding element but has to be available by a person who will open the shielding element. Please note, that it is also possible to fix an opening tool to the shielding element. However, to avoid unauthorized access to the shielded components it is preferred to refrain from fixing an opening tool to the shielding element.

According to another aspect of the present invention a shielding element comprises an annular side wall for surrounding those elements of a circuit that have to be shielded against electromagnetic radiation, the side wall defining a bottom and a ceiling opening, and a cover for closing the ceiling opening, wherein the annular side wall and the cover are defined as parts of an integral cap by a predetermined breaking line.

This kind of shielding element according to the present invention has the additional advantage that it can be formed from sheet metal by means of a punching and bending press.

If the shielding element is not only necessary for screening the components against spurious emission or irradiation but also to protect the components against dust, water and the like it is preferred the predetermined breaking line is formed by a half cut or by at least one notch.

On the other hand, if it's necessary, that the area shielded by the shielding element needs to be ventilated. e.g. for heat discharge, it is preferred that the predetermined breaking line is formed by at least one perforation.

According to a preferred refinement of the present invention two parallel predetermined breaking lines are formed by notches and/or perforations to define a tear open strap.

In case that notches are used to define a determined braking line, in particular a tear open strap. It is possible to provide one notch in the outer surface of the shielding element and the other in the inner surface thereof. However. It is preferred that the two parallel notches are both formed in one surface of the cap.

According to another development of the present invention the cover is provided with an engaging element for being engaged by a tear open tool, wherein the engaging element is preferably formed by a hole for inserting an engaging pin of a tear open tool. The hole is either defined by a half cut or a notch or is already punched through in dependence on the kind of forming the predetermined breaking line.

Instead of a hole one or more tongues can be provided as engaging element(s). In this case the tongue or tongues is/are defined by predetermined breaking lines, too.

The breaking lines can be provided either in a side wall portion adjacent to an upper edge thereof or in a cover portion adjacent to its peripheral edge.

BRIEF DESCRIPTION OF THE DRAWINGS

The present invention will be explained in more detail hereinafter with reference to accompanying drawings showing preferred embodiments of the present invention.

FIGS. 7a to 7f show cross sectional views of a part of a shielding element substantially along line VII—VII in FIG. 5 for illustrating different kinds of breaking lines used with a shielding element according to a second aspect of the present invention;

FIG. 8a and 8b show cross sectional views of a shielding element according to the present invention closed by a cover after destroying the predetermined breaking line for repair;

FIG. 9 shows a top view of a part of a shielding element according to the present invention to illustrate the arrangement of predetermined breaking lines for forming a tear open strap; and FIG. 10 shows a top view of a part of a shielding element according to the present invention to illustrate the arrangement of breaking lines for forming tongues as engaging elements for a tear open tool.

In the different figures of the drawings similar elements are provided with the same reference signs.

DETAILED DESCRIPTION OF THE PREFERRED EMBODIMENTS

Figure 1:
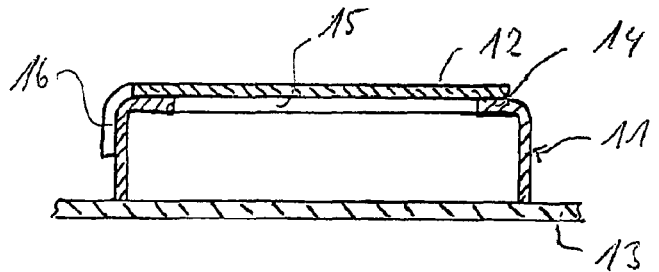
FIG. 1 shows a cross sectional view of a shielding element according to the present invention.
Figure 2:
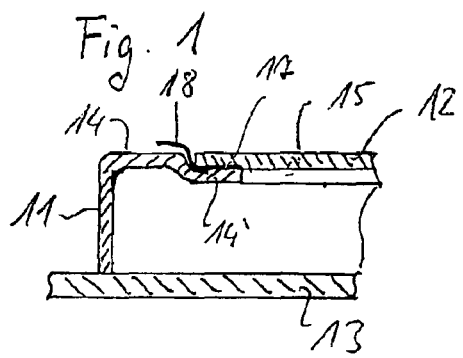
FIG. 2 shows a cross sectional view of a part of a shielding element according to the present invention to illustrate another type of predetermined breaking line.

As shown in FIG. 1 a shielding element for screening electric and/or electronic components of an electric and/or electronic circuit comprises an annular side wall 11 and a cover 12. The side wall 11 is mounted onto a printed circuit board 13 in conventional manner, e.g. by soldering or the like. The annular side wall 11 comprises an annular flange 14 that extents into an inside direction and defines a ceiling opening 15 that is closed by the cover 12. The cover 12 comprises a tongue 16 that can be used as an engaging element for engagement with a tear of tool for tearing off the cover 12 from the annular side wall 11.

The cover 12 is detachable attached to the side wall 11 in the overlapping area between the flange 14 and a peripheral margin of the cover 12.

The predetermined breaking line can form by soldering, spot welding or by gluing. In the letter case it is preferred to use a conductive adhesive. The cover 12 can be made of sheet metal or a metallic foil.

For opening the ceiling opening 15 of the shielding element shown in FIG. 1 the tongue 16 is bent away from the side wall 11 so that a tear open tool can be brought into engagement with the tongue to tear off the cover 12 from the annular side wall 11. For example, it is possible to use a tear open toot having a wind up bar with a slit into which the tongue 16 can be inserted so that the cover is wrapped around the wind up bar during removing the cover from the annular side wall.

To obtain a flat upper surface of the inventive shielding element the flange 14 is provided with a supporting portion 14 that is depressed in such a way that a cover 12 supported by the supporting portion has its surface in alignment with the upper surface of the remaining flange 14. In this case the cover 12 is glued to the side wall 11. i.e. to the supporting portion 14' by means of an adhesive, preferably by means of a conductive adhesive 17.

A tear of wire 18 or tear of strap can be integrated into the glued region to cut the adhesive 17 for removing the cover 12 from the side wall 11.

Figure 3:
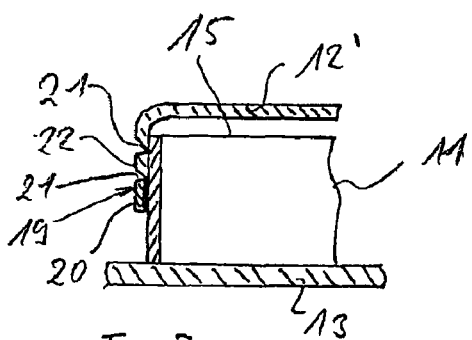
FIG. 3 shows a cross sectional view of a part of a shielding element of the present invention to illustrate an additional kind of predetermined breaking line.

According to FIG. 3 the cover 12' is provided with a pheripheral flange 19 extending substantially perpendicular to a main surface of the cover 12' so that the cover 12' is substantially cap shaped. The peripheral flange is attached to the side wall 11' in a fixing area 20 by means of spot-welding, soldering or gluing. First and second notches 21 provided in the peripheral flange 19 defining a predetermined breaking line, in particular a breaking line formed by a tear open strap 22 that can be removed for separating the cover 12' from the fixing area 20 and for removing the cover 12' from the side wall 11' to open the ceiling opening.

Figure 4:
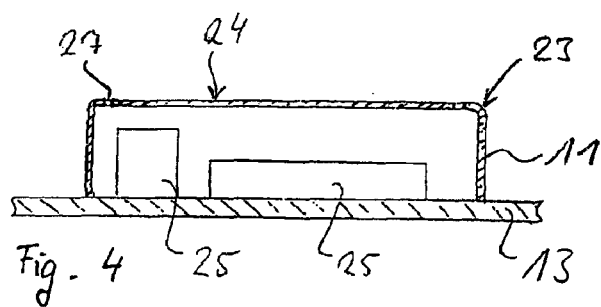
FIG. 4 shows a cross sectional view of a shielding element according to another embodiment of the present invention.

According to FIG. 4 a shielding element according to another embodiment of the present invention is formed as an integral cap 23 made from sheet metal. The integral cap comprises an annular side wall 11 and a ceiling portion 24. The cap 23 is mounted on a printed circuit board 13 to screen electric and/or electronic components 25 against environmental influences, in particular against electro magnetic radiation or emission.

Figure 5:
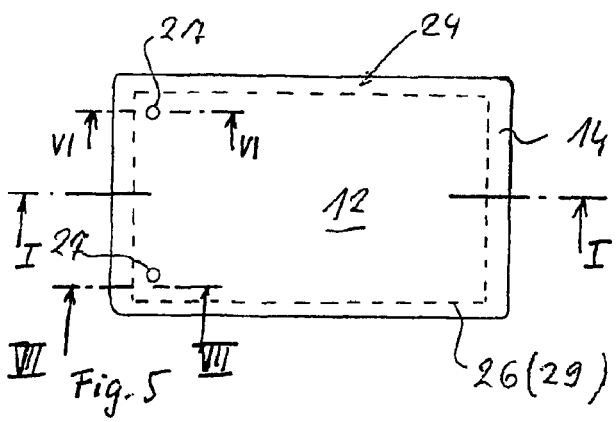
FIG. 5 shows a top view of the shielding element according to FIG. 4.
Figure 6:
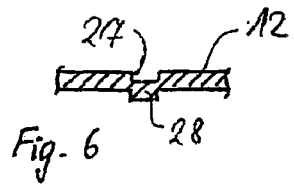
FIG. 6 shows a cross sectional view substantially along line VI—VI in FIG. 5.

As can be seen in FIG. 5 the ceiling portion 24 is divided into a peripheral flange 14 and a cover 12 by a predetermined breaking line 26 that can be formed, e.g. by a perforation 29. To remove the cover 12 from the cap 23 by breaking the predetermined breaking line 26, holes 27 are provided in the cover 12. The holes 27 can be punched through so that an engagement pin of a tear open tool can be inserted therein. However, as shown in FIG. 6 the holes 27 in the cover 12 can be formed by a half cut, i.e. they are not punched through but remains closed by a plug 28 formed by displacing material during half cutting the hole 27. In this case the hole 27 have to be punched through first by a corresponding engagement pin to remove the plug 28 completely prior to completely inserting an engagement pin of a tear open tool.

As shown in FIG. 7a the predetermined breaking line 26 can be formed by a single notch 21. According to FIG. 7b the breaking line 26 can be also formed by two notches 21 one of which is provided in the upper surface of the ceiling 24 whereas the other notch 21 is formed in a parallel manner in the inner or lower surface of the ceiling 24.

As shown in FIG. 7c both notches 21 for forming the predetermined breaking line 26 are provided in the outer surface of the cap 23.

FIG. 7d is an enlarged view of a part of the shielding element according to FIGS. 4 and 5 showing the openings 29 of the perforation in more detail. Instead of small holes it is also possible to use slits or the like for the perforation 29 defining the predetermined breaking line 26.

FIG. 7e shows a predetermined breaking line formed by a half cut.

A half cut can be provided by means of a bending and punching press that is used for producing an annular side wall portion for a conventional shielding element since instead of punching through or cutting out the ceiling opening of the annular side wall the ceiling opening is only half cut by reducing the cutting depth of the punching tool to less than the thickness of the ceiling of the cap. Therefore, the cap for an inventive shielding element can be produced without essential modifications of the machinery used for producing conventional shielding elements.

After removing the cover 12 from the cap 23 and after repairing the components within the annular side wall 11 a replacement cover 32 is put onto the annular side wall in a conventional way. The replacement cover 32 can be clamped or snapped on the side wall in a conventional way.

According to FIG. 7f the predetermined breaking line is provided in the side wall 11 of the cap 23 so that the cover 12 is formed by the ceiling 24 and an upper portion of the annular side wall 11. Although it is possible to provide one or more notches, or a perforation to form the predetermined breaking line 26, it is indicated as a notch 21. For mounting a replacement cover 32 two or more supporting tongues 30 are provide at the side wall 11. The tongues are arrange in a spaced relationship along the annular side wall 11 and are formed for example by cutting out and bending parts of the annular side wall.

As shown in FIG. 5b a peripheral flange of a replacement cover 32 is inserted between the tongue 30 and the annular side wall 11 preferably to being clamped thereby.

In case that a pair of notches or perforations is used to define the predetermined breaking line 26, it is possible to arrange the notches 21 or perforations in the manner shown in FIG. 9 to define a tear open strap 31. The tear open strap 31 is provided with a strap portion 33 having a hole 27 partly or completely cut out as an engaging means for engaging a pin of a tear open tool.

To open the shielding element having a breaking line as explained in connection with FIG. 9 an engagement tool, in particular an pin thereof is inserted into the hole 27 of the flap portion 33. Then the flap portion is broken out of the ceiling 24 so that it can be gripped for tearing off the tear open strap 31 along the breaking line 26.

According to FIG. 10 tongues 34 of the cover 12 are defined by additional breaking lines 26'. As shown in FIG. 10 aperture regions 35 are defined by the additional breaking lines 26' and the main breaking line 26.

To open a shielding element formed by a cap 23 provided with a breaking line pattern 26, 26' as shown in FIG. 10 the aperture regions 35 are punched through first to open the aperture and then a suitable tear open tool can be used to bent the tongues 34 into an up ward position in which a suitable tear open tool. e.g. an wind up bar with corresponding slits for accommodating the tongues 34 can be brought into engagement with the tongues for removing the cover by winding it up.

According to the present invention a shielding element is provided that simplifies the production of a electronic or electronic circuit since only one part has to be handled during the production process. Since a destroyable predetermined breaking line is used as a joint between a cover and a side wall of the shielding element, the shielding element protects the circuit elements coverced thereby against unauthorized access. Furthermore, connection problems are solved and microfony can be reduced.

What is claimed is:

1. Shielding element for electric and/or electronic components of an electric and/or electronic circuit, comprising:

an annular side wall (11) for surrounding those elements (25) of a circuit that have to be shielded against electromagnetic radiation, said side wall (11) defining a bottom and a ceiling opening (15), and a cover (12, 12') for closing the ceiling opening (15), characterized, in that said cover (12, 12') is detachable attached to said side wall (11) by joint means that comprises a predetermined breaking line and has to be destroyed for detaching said cover (12, 12') from said side wall (11), and said predetermined breaking line is formed in an overlapping area of said cover (12, 12') and said side wall (11).

2. Shielding element as claimed in claim 1, characterized in that said cover (12') is provided with a peripheral flange (19) extending substantially perpendicular to its main surface and forming said portion for overlapping said annular side wall (11).

3. Shielding element as claimed in claim 2, characterized in that said annular side wall is provided with an annular flange (14) extending into said ceiling opening (15) and forming said portion to be overlapped by said cover (12).

4. Shielding element as claimed in claim 2, characterized in that said breaking line (26) is formed by spot-welding said cover (12, 12') to said annular side wall (11) in said overlapping area.

5. Shielding element as claimed in claim 2, characterized in that said breaking line (26) is formed by soldering said cover (12, 12') to said annular side wall (11) in said overlapping area.

6. Shielding element as claimed in claim 2, characterized in that said breaking line is formed by gluing said cover (12', 12) to said annular side wall (11) in said overlapping area.

7. Shielding element as claimed in claim 2, characterized in that said cover (12, 12') is provided with tear open means (16, 18) for removing said cover (12, 12') from said side wall (11) to open said ceiling opening (15).

8. Shielding element as claimed in claim 7, characterized in that said cover (12) is provided with a tongue (16) for engaging a tear open tool.

9. Shielding element as claimed in claim 8, characterized in that a tear off wire or strap (18) is integrated into said predetermined breaking line (26) formed by gluing.

10. Shielding element for electric and/or electronic components of an electric and/or electronic circuit, comprising:

an annular side wall (11) for surrounding those elements (25) of a circuit that have to be shielded against electromagnetic radiation, said side wall (11) defining a bottom and a ceiling opening (15), and a cover (12) for closing the ceiling opening (15), wherein said annular side wall (11) and said cover (12) are defined as parts of an integral cap (23) by a predetermined breaking line (26), characterized, in that said predetermined breaking line (26) is formed by two parallel notches (21) and/or perforations (29) to define a tear open strap (31).

11. Shielding element as claimed in claim 10, characterized in that said two parallel notches (21) are both formed in one surface of said cap (23).

12. Shielding element as claimed in claim 11, characterized in that said cover (12) is provided with an engaging element (27, 34), for being engaged by a tear open tool.

13. Shielding element as claimed in claim 11, characterized in that said engaging element is formed by a hole (27) for insert of a tear open tool.

14. Shielding element as claimed in claim 11, characterized in that said engaging element is formed by a tongue (34) defined by said predetermined breaking line or lines (26, 26').

15. Shielding element as claimed in claim 13, characterized in that said predetermined breaking line (26) is provided in a side wall portion (11) adjacent to an upper edge thereof.

16. Shielding element as claimed in claim 14, characterized in that said predetermined breaking line (26) is provided in cover (12) portion adjacent to its peripheral edge.

* * * * *

UNITED STATES PATENT AND TRADEMARK OFFICE
CERTIFICATE OF CORRECTION

PATENT NO. : 6,903,262 B2
DATED : June 7, 2005
INVENTOR(S) : Blersch

It is certified that error appears in the above-identified patent and that said Letters Patent is hereby corrected as shown below:

Column 8,
Line 6, delete "insert" and insert -- inserting an engaging pin --.

Signed and Sealed this

Tenth Day of January, 2006

JON W. DUDAS
*Director of the United States Patent and Trademark Office*